United States Patent
Xiong et al.

(10) Patent No.: US 9,171,891 B2
(45) Date of Patent: Oct. 27, 2015

(54) AMOLED DISPLAY PANEL AND AMOLED DISPLAY DEVICE

(71) Applicant: Shanghai Tianma Micro-Electronics Co., Ltd., Shanghai (CN)

(72) Inventors: Zhiyong Xiong, Shanghai (CN); Dayong Huang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/929,479

(22) Filed: Jun. 27, 2013

(65) Prior Publication Data

US 2014/0166994 A1    Jun. 19, 2014

(30) Foreign Application Priority Data

Dec. 14, 2012    (CN) .......................... 2012 1 0546837

(51) Int. Cl.
*H01L 29/08* (2006.01)
*H01L 27/32* (2006.01)
*H01L 51/52* (2006.01)

(52) U.S. Cl.
CPC .......... *H01L 27/3244* (2013.01); *H01L 51/529* (2013.01); *H01L 51/5246* (2013.01); *H01L 27/3276* (2013.01)

(58) Field of Classification Search
USPC ........... 313/504–512; 257/40, 52, 59, 98–100
See application file for complete search history.

(56) References Cited

U.S. PATENT DOCUMENTS

| | | | |
|---|---|---|---|
| 7,019,458 B2 * | 3/2006 | Yoneda | 313/512 |
| 2004/0207314 A1 | 10/2004 | Aitken et al. | |
| 2005/0078446 A1 * | 4/2005 | Bae | 361/687 |
| 2009/0167155 A1 * | 7/2009 | Kwak | 313/504 |
| 2011/0241541 A1 | 10/2011 | Liu et al. | |

FOREIGN PATENT DOCUMENTS

| | | |
|---|---|---|
| CN | 1832223 B | 9/2006 |
| EP | 1503427 A2 | 2/2005 |
| EP | 1693908 A2 | 8/2006 |

\* cited by examiner

*Primary Examiner* — Cuong Q Nguyen
*Assistant Examiner* — Nishath Yasmeen
(74) *Attorney, Agent, or Firm* — Alston & Bird LLP

(57) ABSTRACT

An Active Matrix Organic Light Emitting Diode (AMOLED) display panel is disclosed. The display panel includes first and second substrates, and a glass frit layer bonding the first and the second substrates in an edge encapsulation area of the AMOLED display panel. The second substrate includes an electrode overlapped with the glass frit layer, and the electrode is connected to a heat conduction component.

18 Claims, 5 Drawing Sheets

AMOLED DISPLAY PANEL AND AMOLED DISPLAY DEVICE

CROSS-REFERENCES TO RELATED APPLICATIONS

This application claims priority to Chinese patent application No. 201210546837.7 filed on Dec. 14, 2012 and titled "AMOLED DISPLAY PANEL AND AMOLED DISPLAY DEVICE", the contents of which is incorporated herein by reference in its entirety.

FIELD OF THE INVENTION

The present invention relates to the field of displays, and in particular to an AMOLED display panel and an AMOLED display device.

BACKGROUND OF THE INVENTION

With the booming development of flat panel display technology, an AMOLED (Active Matrix Organic Light Emitting Diode) display, compared with traditional liquid crystal displays (LCD), has excellent features, such as being self-luminous so that a backlight is not needed, low power consumption, no visual angle restriction, and high response rate. In addition, AMOLED displays have lighter weight and thinner thickness. As a result, the AMOLED display is expected to dominate in the next generation of flat panel display technology and to be used more widely.

Currently AMOLED display panels comprise an upper substrate and a lower substrate, where the upper substrate and the lower substrate are bonded together by a glass frit layer on the edge encapsulation areas of the substrates. A visible test, i.e. VT test, is typically carried out after the panel is manufactured. During this VT test, the picture luminance is increased in the display area of the display panel, and the luminance is achieved generally by increasing the current of the circuit of the display panel. It is quite difficult to change the resistance of the circuit of the display panel, since the display panel has been properly manufactured. As a result, increasing the picture luminance is achieved generally by increasing the input voltage. But when the VT test is performed, heat is generated in some elements or devices in the circuit of the display panel if the input voltage is increased, and in particular, more heat is generated in an electrode with relatively small cross-sectional area and relatively large resistance. Some of the electrodes partially overlap with the glass frit layer in the encapsulation area, so that heat is transmitted to the glass frit layer by the heated electrode, and the glass frit layer may be seared. This may affect the encapsulation efficacy and the performance of the display during the VT test.

SUMMARY OF THE INVENTION

One inventive aspect is an Active Matrix Organic Light Emitting Diode (AMOLED) display panel. The display panel includes first and second substrates, and a glass frit layer bonding the first and the second substrates in an edge encapsulation area of the AMOLED display panel. The second substrate includes an electrode overlapped with the glass frit layer, and the electrode is connected to a heat conduction component.

Another inventive aspect is an Active Matrix Organic Light Emitting Diode (AMOLED) display device. The display device includes an AMOLED display panel, which includes first and second substrates, and a glass frit layer bonding the first and second substrates in an edge encapsulation area of the AMOLED display panel. The second substrate includes an electrode overlapped with the glass frit layer, and the electrode is connected to a heat conduction component.

DETAILED DESCRIPTION OF THE EMBODIMENTS

According to some embodiments, an AMOLED display panel includes an electrode overlapped with a glass frit layer and that is connected to a heat conduction component, such that heat from the electrode is conducted away to avoid excessive heat on the electrode.

Detailed description is made below of certain implementation modes of the AMOLED display panel and the AMOLED display device according to various embodiments of the invention. Reference is made to the drawings, in which the sizes and shapes of various features are not reflected on a real scale, but which aims to illustrate certain aspects of the invention.

Figure 1A:
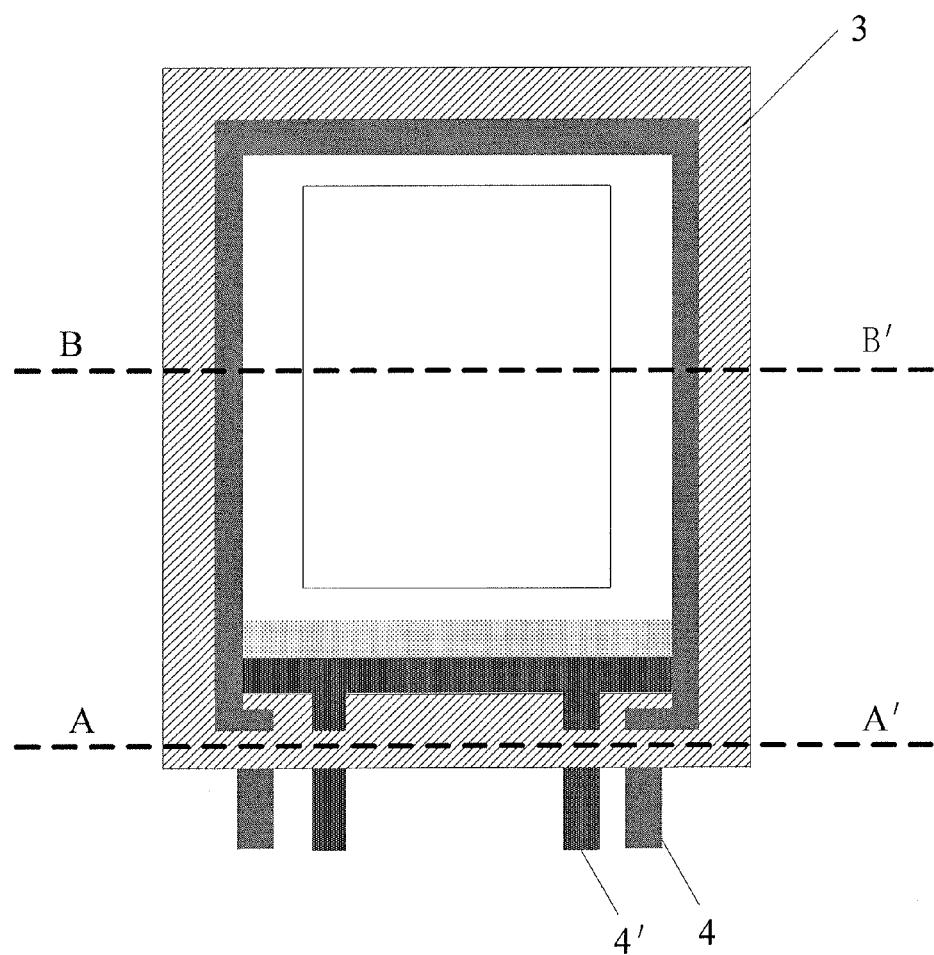
FIG. 1A is a plan view of the local structure of an AMOLED display panel the according to an embodiment of the invention.
Figure 1B:
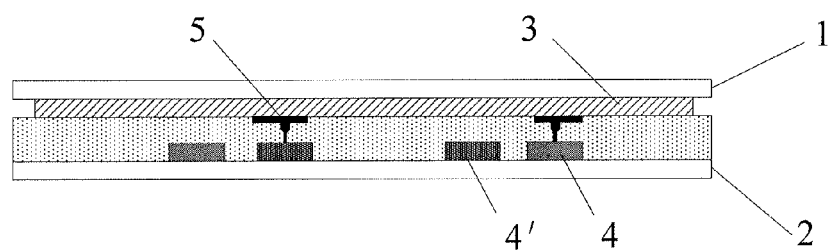
FIG. 1B is a cross-sectional schematic diagram of the partial structure in FIG. 1A.

FIG. 1A is a plan view of a local structure of the AMOLED display panel according to an embodiment of the present invention. The AMOLED display panel shown includes a first substrate 1 and a second substrate 2 (not shown in FIG. 1A), a glass frit layer 3 bonding the first substrate 1 and the second substrate 2 along the edge of the encapsulation area of the AMOLED display panel. The second substrate 2 includes electrodes 4 and 4'—overlapped with the glass frit layer 3, and the electrode 4 and 4' are connected to a heat conduction component 5. FIG. 1B is a cross-sectional schematic diagram of the embodiment shown in figure in FIG. 1A taken along A-A'. The location of the heat conduction component 5 and the connection to the electrode 4 and 4' are not limited to the embodiment shown in FIG. 1B. The heat conduction component 5 may be any heat conduction component which has the function of heat conduction and does not cause a short circuit after being connected to the electrode 4 and 4'. In some embodiments, the heat conduction component is placed on the AMOLED display panel in order to simplify the manufacturing process without damaging the layered structure of the AMOLED display panel.

In the embodiment shown, the electrode 4 overlapped with the glass frit layer 3 is connected to a heat conduction component 5, which conducts heat from the electrode 4 to avoid excessive heat on the electrode 4. In addition, the original heat conduction component in the AMOLED display panel can be used without adding another heat conduction component.

In another embodiment of the present invention, the heat conduction component 5 may be a U-shaped metal pad 51 located under the glass frit layer 3. In some embodiments, the heat conduction component 5 may also be a metal layer which has substantially no electrical function for the electronic circuit, e.g. a metal component in a panel code printing area.

Figure 2A:
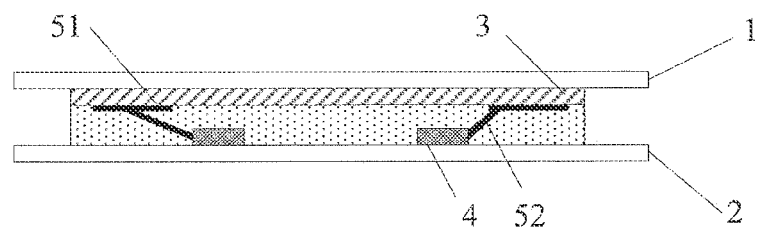
FIG. 2A is a cross-sectional schematic diagram of a U-shaped metal pad connected to the electrode of the AMOLED display panel by a via hole according to an embodiment of the invention.

Specifically, the U-shaped metal pad 51 in the shown embodiment may be connected to the electrode 4 by a first via hole 52. In the display panel, circuit metal wiring may be set at one side of the substrate. In the shown embodiment of the invention, the electrode 4 is located on a first side (the side of A-A' in FIG. 1A) of the second substrate 2. The first side (the side of A-A' in FIG. 1A) comprises a relatively large amount of circuit metal wiring, and the U-shaped metal pad 51 is located along the other three sides of the second substrate. The other three sides comprise a relatively small amount of circuit metal wiring. FIG. 2A is a cross-sectional schematic diagram of the U-shaped metal pad 51 connected to the electrode 4 by the first via hole 52 in the A-A' portion of FIG. 1A.

Figure 2B:
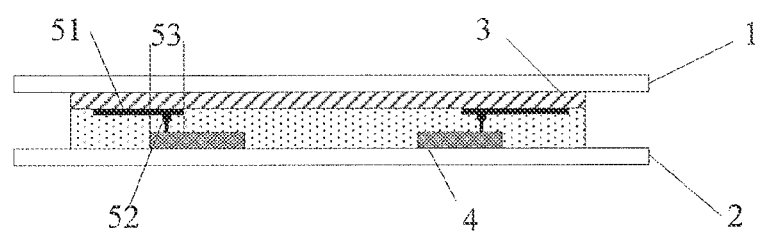
FIG. 2B is another cross-sectional schematic diagram of a U-shaped metal pad connected to the electrode by a via hole according to an embodiment of the invention.

It can be seen from FIG. 2A that, in this embodiment of the invention, the U-shaped metal pad 51 is located along the other three sides which are different from the side having the access terminal of the electrode 4. As shown, there is no overlapping part between the U-shaped metal pad 51 and the electrode 4 on that side. As shown, the first via hole 52 is inclined. At least because the process of making the first via hole is relatively complex, in some embodiments, the U-shaped metal pad 51 or/and the electrode 4 extend to form extending parts respectively. An example in which both the U-shaped metal pad 51 and the electrode 4 are extended is shown in FIG. 2B. As shown, the extending parts form overlapping part 53. In some embodiments, the first via hole 52 is in the overlapping part 53, so that the U-shaped metal pad 51 is connected to the electrode 4 in the overlapping part 53 by the first via hole, as shown in FIG. 2B.

In the shown embodiment of the invention, the U-shaped metal pad 51 is located along the other three sides which are different from the side having the access terminal of the electrode 4. This avoids a possible short circuit caused by the U-shaped metal pad 51 touching other circuit metal wirings. The U-shaped metal pad 51 is connected to the electrode 4 in the shown embodiment of the invention such that the electrode 4 is connected to the two ends of the U-shaped metal pad 51 respectively to achieve better heat dissipating function. In addition, the U-shaped metal pad 51 and the electrode 4 respectively have extending parts overlapped with each other in the shown embodiment of the invention, and the first via hole is set in the overlapping part at least to further simplify the manufacturing process.

Figure 3A:
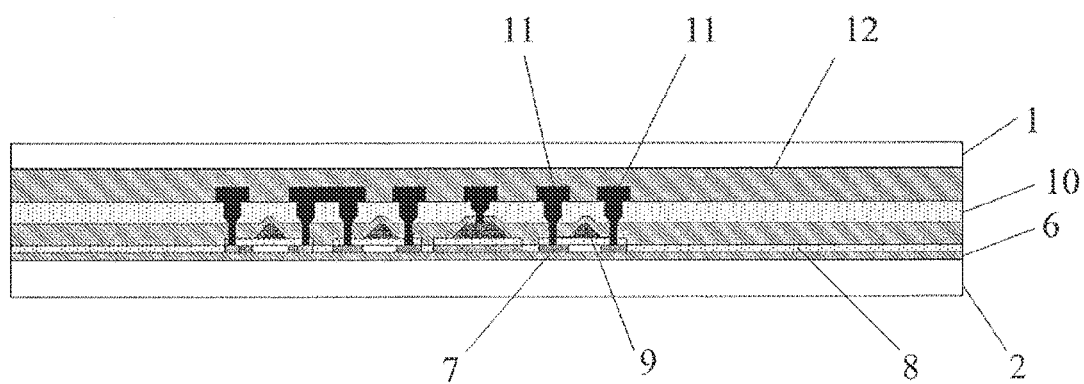
FIG. 3A is a local cross-sectional schematic diagram of the display area of the AMOLED display panel comprising a thin film transistor according to an embodiment of the invention.

Another embodiment of the present invention includes an AMOLED display panel, which, in addition to structures discussed above, includes a thin film transistor (TFT) located in the display area of the AMOLED display panel, as shown in FIG. 3A, which is a cross-sectional schematic diagram of the display area of an AMOLED display panel according to an embodiment of the invention.

In FIG. 3A, a buffer layer 6, an active layer 7, a gate insulating layer 8, a gate 9, a medium isolating layer 10, source/drain 11 and an insulating layer 12 are sequentially formed on the second substrate 2. The medium isolating layer 10 is used for isolating the gate 9 from the source/drain 11, the gate insulating layer 8 isolates the gate 9 from the active layer 7. To simplify the manufacturing process and achieve good operability in the etching process, the medium isolating layer 10 located between the U-shaped metal pad 51 and the electrode 4, at the side frame of the display panel may be not etched off, that is, the medium isolating layer 10 may be included between the U-shaped metal pad 51 and the electrode 4 in some embodiments of the invention. The medium isolating layer between the U-shaped metal pad 51 and the electrode 4 may be somewhat different based upon a different TFT structure, and this discussion is not to be considered as being limitative.

Further, the U-shaped metal pad 51 in some embodiments of the invention may be made of the same material as the source/drain 11 of the thin film transistor TFT in the AMOLED display panel. For example, the material may include Ti/Al/Ti. The electrode 4 may be made of the same material as the gate 9 of the thin film transistor TFT, and the material may include Mo. In order to simplify the manufacturing process, the U-shaped metal pad 51 and the source/drain 11 may be formed simultaneously by an etching process. Additionally or alternatively, the electrode 4 and the gate 9 may be formed simultaneously by an etching process.

Figure 3B:
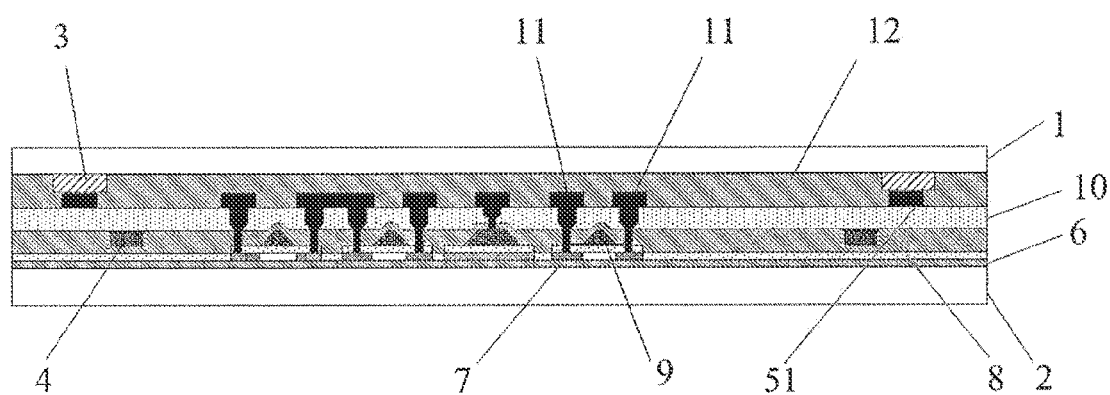
FIG. 3B is another local cross-sectional schematic diagram of the AMOLED display panel according to an embodiment of the invention.

FIG. 3B, a cross-sectional schematic diagram taken along B-B' of the AMOLED display panel of FIG. 1A. As shown, the U-shaped metal pad 51 is located on the same layer as the source/drain, and the electrode 4 is located on the same layer as the gate 9. Accordingly, the respective pairs of layers may be formed simultaneously.

The location of the heat conduction component connected to the electrode 4 has an influence on the heat conduction time. That is, the closer the conduction component is to the electrode 4, the quicker that he will be conducted away. In order to conduct the heat from the overlapping part of the glass frit layer 3 and the electrode 4 as quickly as possible, the overlapping part of the electrode 4 and the glass frit layer 3 may be extended to obtain an extending part of the electrode 4, the end of the U-shaped metal pad 51 is then extended to obtain an extending part of the U-shaped metal pad 51, the two extending parts form an overlapping area in which the electrode 4 is connected to the U-shaped metal pad 51 by the first via hole such as that shown in FIG. 2B.

The AMOLED display panel according to this embodiment of the invention, includes no additional heat conduction component because the electrode is connected to the U-shaped metal pad by the via hole. In some embodiments, a different connection is used, for example, based upon a different TFT structure of the display panel. In some embodiments, heat from the electrode is effectively conducted out without changing the original layered structure of the display panel, thus preventing the glass frit layer from being seared due to excessive heat gathered from the electrode during the VT test.

During the VT test, the voltage input is PVDD and PVEE, and the current flowing through the AMOLED display panel are calculated using the formulas as follow:

$$I_{OLED}=m*[½*\mu*C_{ox}*W/L*(V_{PVDD}-V_{Data}-V_{th})^2];$$
(when there is no threshold voltage compensation circuit) and $$I_{OLED}=m*[½*\mu*C_{ox}*W/L*(V_{PVDD}-V_{Data})^2];$$ (when there is a threshold voltage compensation circuit).

$I_{OLED}$ represents current flowing through the AMOLED display panel, m represents the number of pixels, μ represents transistor mobility, Cox represents memory capacitance, W/L represents transistor channel width/length ratio, $V_{PVDD}$ represents the input voltage of the PVDD, $V_{Data}$ represents the voltage of a Data wire, and $V_{th}$ represents the starting threshold voltage of a transistor.

It can be seen from the formulas above that $I_{OLED}$ is mainly under the influence of $V_{PVDD}$. $V_{PVDD}$ is, therefore, increased to increase $I_{OLED}$ during the VT test. That is, when the voltage input to the PVDD is increased, the current flowing through the access terminal of the PVDD is also increased. However, at the access terminal of the PVDD the wiring may be quite thin, and the resistance of the PVDD may be correspondingly quite large. Accordingly, there may be much heat generated at the access terminal of PVDD due to the large current and the large resistance.

It is quite clear from the above analysis that, much heat will likewise be generated on excess terminal of PVEE. The glass frit layer for encapsulating the first substrate and the second substrate is located above the PVDD and the PVEE. Thus, a Frit material may be seared, for example, when the current flowing through the PVDD or the PVEE is great than 0.4 A. Accordingly, the PVDD electrode and the PVEE electrode are used as examples for description in the discussion herein.

Figure 4A:
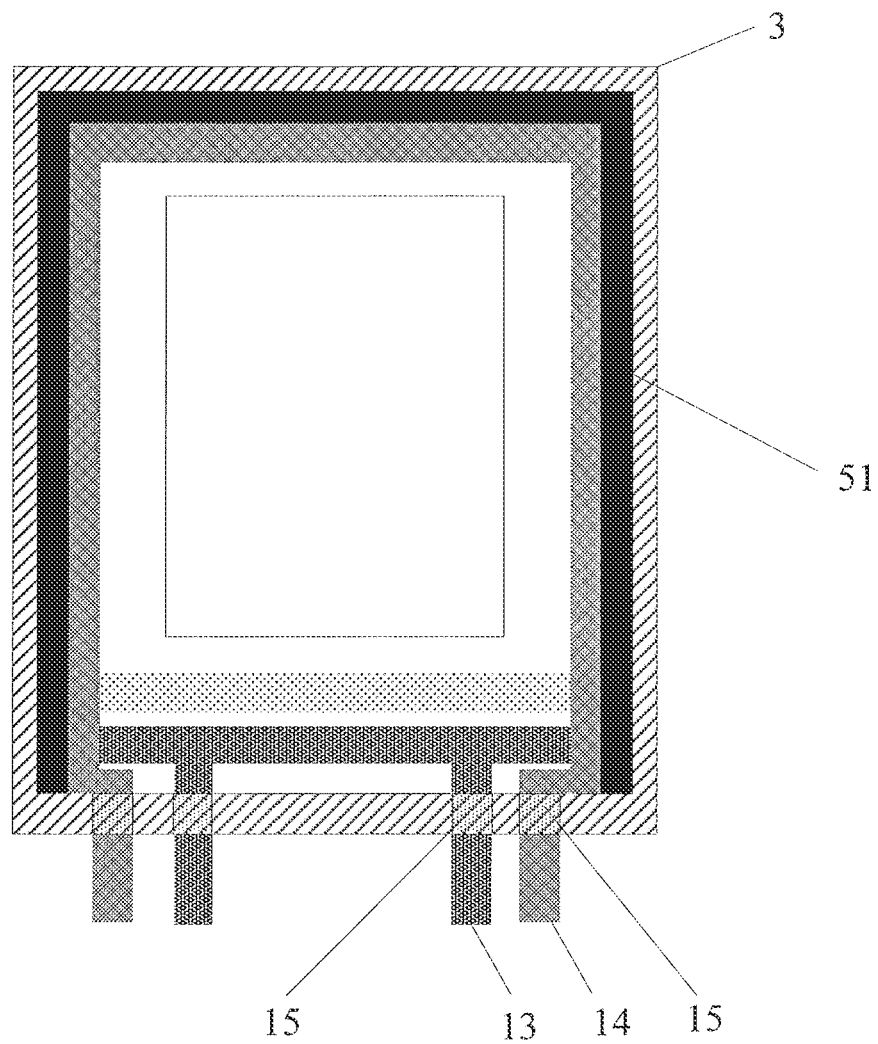
FIG. 4A is another plan schematic diagram of the AMOLED display panel according to an embodiment of the invention.

FIG. 4A is a plan schematic diagram of a display panel according to an embodiment. As shown in FIG. 4A, the access terminal of PVDD 13 and the access terminal of the PVEE 14 are overlapped with the glass frit layer 3. If a high enough voltage is used, enough heat will be generated on PVDD 13 and PVEE 14 that the glass frit layer 3, overlapped with PVDD 13 and PVEE 14, may be seared. In some embodiments, PVDD 13 or PVEE 14 are connected to the heat conduction component according to one or more of the embodiments discussed herein. In some embodiments, PVDD 13 or the PVEE 14 are connected to a U-shaped metal pad according to one or more of the embodiments discussed herein. It can be seen from FIG. 4A that the access terminal of PVDD and the access terminal of PVEE are overlapped with the glass frit layer to form overlapping parts 15. Such a configuration may cause the glass frit layer to be seared. Therefore, preferably in some embodiments of the invention, the access terminal of the PVDD and the access terminal of the PVEE overlapped with the glass frit layer are extended and the end of the U-shaped metal pad is also extended. Thus, the two extending parts are overlapped to form an overlapping area in which one of the access terminals is connected to the U-shaped metal pad by a second via hole (not shown in the drawing).

The heat conduction component connected to PVDD 13 or PVEE 14 may also be another metal layer which has no electrical function for the circuit, e.g. a two-dimensional code square area may be used. In the description the U-shaped metal pad is discussed as an example, and is not to be regarded as being limitative.

Figure 4B:
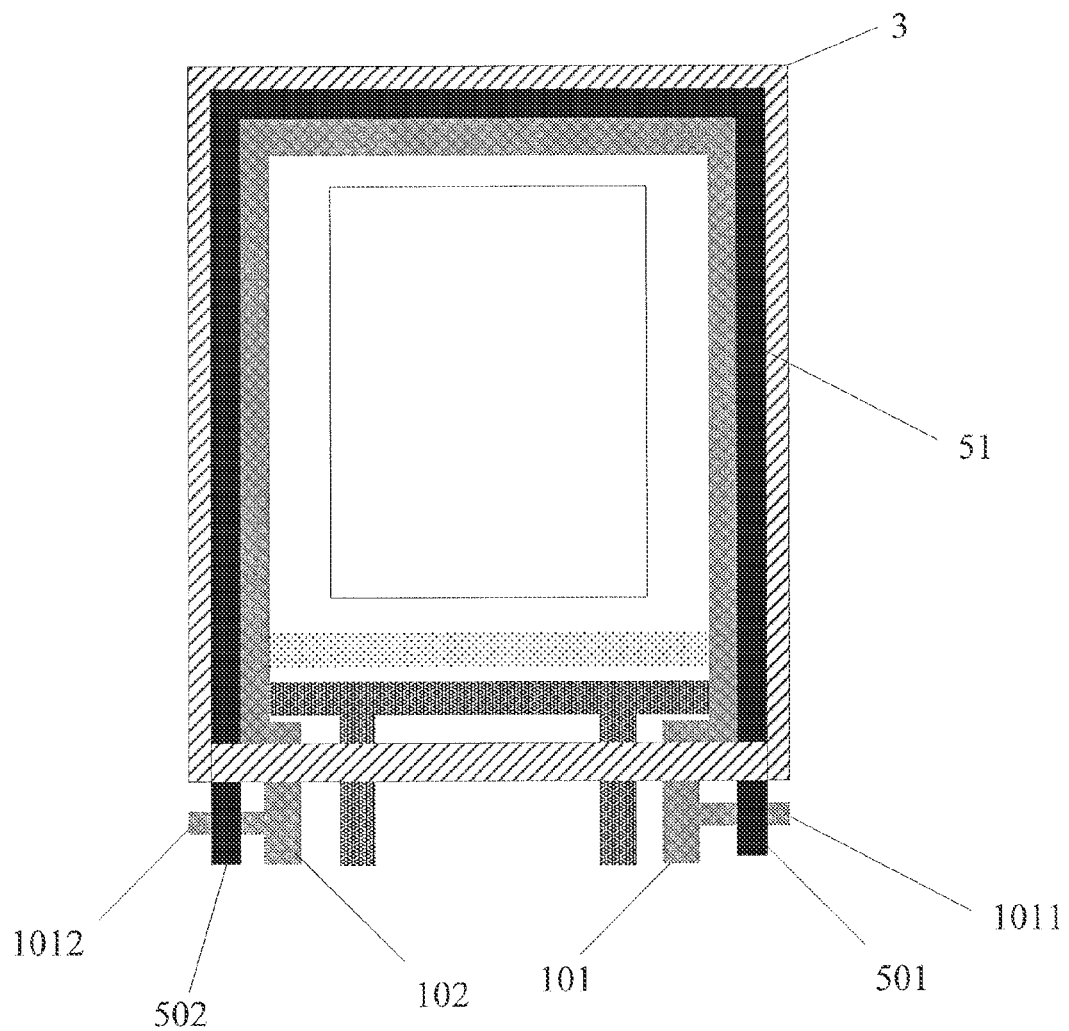
FIG. 4B is a plan schematic diagram showing that PVEE and the U-shaped metal pad are extended to form an overlapping area according to an embodiment of the invention.

In some embodiments, PVDD 13 and PVEE 14 each have two access terminals. In such embodiments, the two access terminals of each electrode may be extended respectively for connecting to the U-shaped metal pad, or just one of the two access terminals could be extended. In some embodiments, the access terminals of PVDD or PVEE form extending parts, which are overlapped with the extending part at the end of the U-shaped metal pad to form an overlapping area in which the access terminals are connected to the U-shaped metal pad by the via hole, as shown in FIG. 4B. In FIG. 4B, the extending part 1011 of the first access terminal 101 of PVEE is connected to the extending part 501 at the first end of the U-shaped metal pad 51, and the extending part 1012 of the second access terminal 102 of PVEE is connected to the extending part 502 at the second end of the U-shaped metal pad 51, so that heat at the overlapping part of PVEE and the glass frit layer is conducted out more quickly.

Further, a short circuit would be caused by simultaneous connection of PVDD and PVEE to the U-shaped metal pad, so in this embodiment of the invention, just PVDD or PVEE is connected to the U-shaped metal pad by the second via hole.

In some embodiments of the invention, the end of PVDD or the end of PVEE is connected to the U-shaped metal pad. On one hand, it guarantees a flexible connection mode, and on the other hand, it realizes quick heat dissipation on PVDD and PVEE to further prevent the glass frit layer overlapped with PVDD and PVEE from being seared.

Some embodiments of the present invention provide an AMOLED display device, which comprises an embodiment of an AMOLED display panel having one or more aspects described herein.

A connection similar to the connection of the electrode to the heat conduction component may be used to connect PVDD or PVEE to the U-shaped metal pad. Alternatively, another connection may be used.

Various modifications and variations of the present invention can be made by those skilled in the art without departing from the spirit and scope of the present invention. Thus, provided that these modifications and variations of the present invention fall within the scope of the claims of the invention and equivalent technologies thereof, the invention is intended to encompass the modifications and variations.

What is claimed is:

1. An Active Matrix Organic Light Emitting Diode (AMOLED) display panel, comprising:
   first and second substrates;
   a glass frit layer bonding the first and second substrates in an edge encapsulation area of the AMOLED display panel;
   a heat conduction component between the first and second substrates,
   wherein the second substrate comprises an electrode overlapped with the glass frit layer, and wherein the electrode is connected to the heat conduction component, and
   wherein the heat conduction component comprises a U-shaped metal component located under the glass frit layer, and the U-shaped metal component is connected to the electrode by a first via hole.

2. The AMOLED display panel according to claim 1, wherein the electrode is located along a first side of the second substrate, and the U-shaped metal component is located along other sides of the second substrate, and the other sides are different from the first side.

3. The AMOLED display panel according to claim 1, wherein the first via hole is in the overlapping area where an extending part of the electrode is overlapped with an extending part of the U-shaped metal component.

4. The AMOLED display panel according to claim 3, wherein the extending part of the electrode is an extending area for the overlapping part of the electrode and the glass frit layer.

5. The AMOLED display panel according to claim 1, wherein the AMOLED display panel further comprises a medium isolating layer located between the U-shaped metal component and the electrode, and the U-shaped metal component is connected to the electrode by the first via hole penetrating through the medium isolating layer.

6. The AMOLED display panel according to claim 1, wherein the AMOLED display panel further comprises a thin film transistor, and the U-shaped metal component and a source/drain of the thin film transistor are made of the same material and located in the same layer.

7. The AMOLED display panel according to claim 1, wherein the AMOLED display panel further comprises a thin film transistor, and the electrode and a gate of the thin film transistor are made of the same material and located in the same layer.

8. The AMOLED display panel according to claim 1, wherein the electrode connected to the U-shaped metal component is a PVDD electrode or a PVEE electrode.

9. The AMOLED display panel according to claim 8, wherein an access terminal of the electrode is connected to the U-shaped metal component by a second via hole.

10. An Active Matrix Organic Light Emitting Diode (AMOLED) display device, comprising:
an AMOLED display panel, wherein the AMOLED display panel comprises:
first and second substrates; and
a glass frit layer bonding the first and second substrates in an edge encapsulation area of the AMOLED display panel; and
a heat conduction component between the first and second substrates,
wherein the second substrate comprises an electrode overlapped with the glass frit layer, and wherein the electrode is connected to the heat conduction component,
wherein the heat conduction component comprises a U-shaped metal component located under the glass frit layer, and an the U-shaped metal component is connected to the electrode by a first via hole.

11. The AMOLED display device according to claim 10, wherein the electrode is located along a first side of the second substrate, and the U-shaped metal component is located along other sides of the second substrate, and the other sides are different from the first side.

12. The AMOLED display device according to claim 10, wherein the first via hole is in the overlapping area where an extending part of the electrode is overlapped with an extending part of the U-shaped metal component.

13. The AMOLED display device according to claim 12, wherein the extending part of the electrode is an extending area for the overlapping part of the electrode and the glass frit layer.

14. The AMOLED display device according to claim 10, wherein the AMOLED display panel further comprises a medium isolating layer located between the U-shaped metal component and the electrode, and the U-shaped metal component is connected to the electrode by the first via hole penetrating through the medium isolating layer.

15. The AMOLED display device according to claim 10, wherein the AMOLED display panel further comprises a thin film transistor, and the U-shaped metal component and a source/drain of the thin film transistor are made of the same material and located on the same layer.

16. The AMOLED display device according to claim 10, wherein the AMOLED display panel further comprises a thin film transistor, and the electrode and a gate of the thin film transistor are made of the same material and located on the same layer.

17. The AMOLED display device according to claim 10, wherein the electrode connected to the U-shaped metal component is a PVDD electrode or a PVEE electrode.

18. The AMOLED display panel according to claim 17, wherein an access terminal of the electrode is connected to the U-shaped metal component by a second via hole.

* * * * *